United States Patent [19]
Shue et al.

[11] Patent Number: 6,015,735
[45] Date of Patent: Jan. 18, 2000

[54] METHOD FOR FORMING A MULTI-ANCHOR DRAM CAPACITOR AND CAPACITOR FORMED

[75] Inventors: Shau-Lin Shue; Hun-Jan Tao; Chia-Shiung Tsai; Jenn-Ming Huang, all of Hsin-Chu, Taiwan

[73] Assignee: Taiwan Semiconductor Manufacturing Co., Ltd., Hsin-Chu, Taiwan

[21] Appl. No.: 09/006,509

[22] Filed: Jan. 13, 1998

[51] Int. Cl.[7] ...................... H01L 21/8242; H01L 21/302
[52] U.S. Cl. ........................... 438/254; 438/708; 438/738; 257/306
[58] Field of Search ................................... 438/253, 255, 438/766, 700, 707, 708, 643, 709

[56] References Cited

U.S. PATENT DOCUMENTS

| | | | |
|---|---|---|---|
| 5,338,393 | 8/1994 | Burmer | 438/709 |
| 5,478,769 | 12/1995 | Lim | 438/253 |
| 5,827,783 | 10/1998 | Hsia et al. | 438/735 |
| 5,843,822 | 12/1998 | Hsia et al. | 438/254 |
| 5,851,898 | 12/1998 | Hsia et al. | 438/398 |

*Primary Examiner*—Wael M. Fahmy
*Assistant Examiner*—William David Coleman
*Attorney, Agent, or Firm*—Tung & Associates

[57] ABSTRACT

The present invention discloses a method for forming a DRAM capacitor that has improved charge storage capacity by utilizing a deposition process wherein alternating layers of doped and undoped dielectric materials are first deposited, a deep UV type photoresist layer is then deposited on top of the oxide layers such that during a high density plasma etching process for the cell opening, acidic reaction product is generated by the photoresist layer when exposed to UV emission in an etch chamber such that the sidewall of the cell opening is etched laterally in an uneven manner, i.e., the doped dielectric layer being etched more severely than the undoped dielectric layer thus forming additional surface area and an improved charge storage capacity for the capacitor formed.

20 Claims, 3 Drawing Sheets

METHOD FOR FORMING A MULTI-ANCHOR DRAM CAPACITOR AND CAPACITOR FORMED

FIELD OF THE INVENTION

The present invention generally relates to a method for forming dynamic random access memory (DRAM) stacked capacitors and more particularly, relates to a method for forming DRAM stacked capacitors by depositing multiple layers of dielectric materials consisting of undoped and doped oxides and a photoresist layer which is capable of generating an acidic reaction product when exposed to UV emission during an etching process such that a multi-anchor capacitor opening can be formed.

BACKGROUND OF THE INVENTION

In modern DRAM devices, small dimensions and high capacitance value per unit area of the capacitor are desirable characteristics for achieving a high charge storage capacity. A typical DRAM device includes a field effect transistor and a storage capacitor. When DRAM devices were first developed, planar type storage capacitors which occupy large wafer real estate were used. In modem memory devices where the dimensions of the devices are continuously being reduced, various techniques for reducing the chip real estate usage for a capacitor becomes more critical. One of such methods involves the stacking of a capacitor over the bit line on the surface of a silicon substrate so that the specific capacitance of a storage capacitor can be increased. The stacked capacitor is normally formed by a layer of a dielectric material such as silicon dioxide or oxide-nitride-oxide sandwiched between two layers of a conducting material such as polysilicon. The effective capacitance of the stacked capacitor is increased over that of a conventional planar capacitor based on its increased surface area. Other methods have also been proposed for achieving higher capacitance on limited chip real estate. For instance, one of such methods stores charges vertically in a deep trench. The method therefore requires the formation of a deep trench and as a result, frequently incur significant processing difficulties. Comparatively, the stacked capacitor approach is more superior in achieving higher specific capacitance in a DRAM storage capacitor.

One of the more common configurations of a stacked capacitor is a fin-type stacked capacitor. The fin-type capacitor has a larger surface area and thus a larger charge storage capacity. A typical method for forming such a stacked capacitor can be started by first providing a semiconductor substrate that is of a silicon nature and forming a field oxide region to isolate field effect transistors built on top of the substrate. The field oxide layer is typically formed by a LOCOS method during which silicon is thermally oxidized to form and to expand vertically into a silicon oxide region. The field effect transistors are normally formed by first growing a thin oxide layer on the silicon substrate surface as a gate oxide, and then forming a polysilicon gate electrode on top of the gate oxide layer. The polysilicon layer which forms the gate electrode is also used to form word lines over the field oxide layer for providing interconnections between the transistors and the peripheral circuits on the chip. After lightly doped drain areas are formed in the substrate by an ion implantation method and sidewall spacers are formed on the gate electrode, the transistor formation is completed by forming source/drain contact areas in the substrate adjacent to the gate electrode. A thick insulating layer can be deposited over the gate electrode and the word line for insulation purpose. A silicon nitride etch stop layer can then be deposited over a planarized top surface of the insulating layer. The planarization process for the insulating layer is normally conducted by a chemical mechanical polishing method.

In the conventional fin-type stacked capacitor, the dielectric layers and the conducting layers are deposited by a chemical vapor deposition technique on top of a silicon nitride etch-stop layer. The number of polysilicon layers deposited is dependent upon the number of fins on the stacked capacitor desired. On top of the final dielectric layer, a photoresist layer is deposited and patterned by conventional photolithographic techniques for etching by a plasma dry etch method to form a capacitor cell opening.

The conventional fin-type stacked capacitor fabrication process is complicated and requires multiple deposition steps for forming the multiple layers of oxide and polysilicon on top of an active device. The multiple deposition steps must be conducted in a multiple number of processing chambers and therefore are time consuming and high cost.

It is therefore an object of the present invention to provide a method for forming a DRAM capacitor that has improved charge storage capacity without the drawbacks and shortcomings of the conventional DRAM capacitor fabrication methods.

It is another object of the present invention to provide a method for forming a DRAM capacitor that has improved charge storage capacity by depositing alternating layers of doped and undoped dielectric materials for forming the capacitor cell.

It is a further object of the present invention to provide a method for forming a DRAM capacitor that has improved charge storage capacity by depositing alternating layers of doped and undoped dielectric materials and a photoresist layer capable of generating an acidic reaction product when exposed to UV radiation.

It is another further object of the present invention to provide a method for forming a DRAM capacitor that has improved charge storage capacity by etching different layers of doped and undoped dielectric materials with an acidic compound such that a zig-zagged sidewall in the capacitor cell opening is formed.

It is still another object of the present invention to provide a method for forming a DRAM capacitor that has improved charge storage capacity by etching a cell opening through doped and undoped dielectric layers in an etch chamber that generates UV emission such that an acidic product from a photoresist layer selectively etches the doped dielectric layer more severely than the undoped dielectric layer and thus forming a stepped configuration in the sidewall of the cell opening.

It is yet another object of the present invention to provide a method for forming a DRAM capacitor that has improved charge storage capacity by utilizing a photoresist layer that is capable of generating an acidic reaction product and an etch chamber that generates UV emission during an etching process such that uneven etching on doped and undoped dielectric layers can be achieved.

It is still another further object of the present invention to provide a method for forming a multi-anchor capacitor by depositing alternating layers of doped and undoped oxide materials and a photoresist material capable of generating an acidic reaction product when exposed to UV radiation such that an uneven sidewall in a cell opening can be formed for the multi-anchor capacitor.

It is yet another further object of the present invention to provide a method for forming a multi-anchor capacitor electrode by depositing alternating layers of doped and undoped oxide material and a photoresist material that is capable of generating acidic reaction product when exposed to UV emission in an etch chamber such that a stepped sidewall in a cell opening can be formed for the formation of the multi-anchor capacitor electrode.

SUMMARY OF THE INVENTION

In accordance with the present invention, a method for forming a DRAM capacitor that has improved charge storage capacity is provided by utilizing alternating layers of doped and undoped dielectric materials and a photoresist layer capable of generating an acidic reaction product such that an uneven sidewall can be formed in the cell opening for forming a DRAM capacitor that has improved charge storage capacity.

In a preferred embodiment, a method for forming a DRAM capacitor that has increased charge storage capacity can be carried out by the operating steps of first providing a preprocessed electronic substrate, then depositing a layer of doped dielectric material on the substrate, then depositing a layer of undoped dielectric material on the doped dielectric layer, then depositing a layer of a photoresist material on the undoped dielectric layer, the photoresist layer is capable of generating an acidic reaction product when exposed to an UV emission, then patterning the photoresist layer for a capacitor cell opening, and etching the cell opening through the undoped and the doped dielectric layers by a technique that generates UV emission such that an acidic reaction product is released from the photoresist layer to selectively etch the doped dielectric layer in a lateral direction to a larger toroidal cavity than the toroidal cavity formed in the undoped dielectric layer.

The method may further include the steps of depositing a second layer of doped dielectric material on the undoped dielectric layer, and depositing a second layer of undoped dielectric material on the second doped dielectric layer. A suitable dielectric material used is silicon oxide or any other dielectric materials. The doped dielectric material can be borophosphosilicate glass (BPSG), phosphosilicate glass (PSG) or borosilicate glass (BSG). The photoresist material which is capable of generating an acidic reaction product when exposed to UV emission contains a photoacid generator. The photoresist layer may suitably be a deep UV material or an I-line material. The patterning step in the method may further include the steps of exposing the photoresist layer to UV radiation, and then developing the cell opening by a caustic-based developing solution. The method may further include the steps of depositing a first conducting layer in the cell opening, depositing a dielectric layer on top of the first conducting layer, and then depositing a second conducting layer on top of the dielectric layer forming the stacked capacitor.

In another preferred embodiment, a method for forming a multi-anchor capacitor electrode can be carried out by the operating steps of first providing a substrate, then depositing a first layer of a doped silicon oxide on the substrate, then depositing a first layer of undoped silicon oxide on the first layer of doped silicon oxide, then depositing a second layer of doped silicon oxide on the first layer of undoped silicon oxide, then depositing a second layer of undoped silicon oxide on the second layer of doped silicon oxide, then depositing a layer of a photoresist material on the second undoped dielectric layer, the photoresist layer is capable of generating an acidic reaction product when exposed to UV emission, then patterning the photoresist layer for a capacitor cell opening, and etching the cell opening through the doped and undoped dielectric layers by a technique that generates UV emission in an etch chamber such that an acidic reaction product is produced by the photoresist layer to selectively etch the doped dielectric layer in a lateral direction to a larger toroidal cavity than the toroidal cavity formed in the undoped dielectric layer. The undoped silicon oxide material can be a undoped silicon glass (USG), while the doped silicon oxide material can be BPSG, BSG or PSG. The substrate used is normally a pre-processed semiconductor device. The photoresist material can be either a deep UV type of material or an I-line type material that contains a photoacid generator. The patterning step may further include the steps of exposing the photoresist layer to UV emission, and developing the cell opening by a caustic-based developing solution.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming a DRAM capacitor that has improved charge storage capacity by alternatingly depositing layers of doped and undoped dielectric materials on a substrate, followed by the deposition of a photoresist layer which is capable of generating an acidic reaction product when exposed to UV emission on top such that, after a cell opening is etched through the doped and the undoped dielectric material layers, the acidic reaction product from the photoresist layer selectively etches the doped dielectric layer in a lateral direction more than the undoped dielectric layer such that a stepped configuration in the sidewall of the cell opening is created.

The present invention novel method can be advantageously carried out by depositing a single doped dielectric layer and a single undoped dielectric layer, or the combination of two or more layers of doped dielectric material and two or more layers of undoped dielectric material with each layer alternatingly contacting a different layer. The dielectric material can be selected from silicon oxide or any other suitable dielectric materials. For instance, the undoped dielectric material can be an undoped silicate glass (USG), while the doped dielectric material can be borophosphosilicate glass (BPSG), borosilicate glass (BSG) or phosphosilicate glass (PSG). The photoresist material that generates an acidic reaction product when exposed to UV radiation can be a deep UV type material or an I-line type material. The photoresist material should contain a photoacid generator (PAG) such that an acidic reaction product can be produced. During a patterning process for the cell opening, the process may further include the steps of first exposing the photoresist layer to UV radiation, and then developing the cell opening by a caustic-based developing solution.

Figure 1:
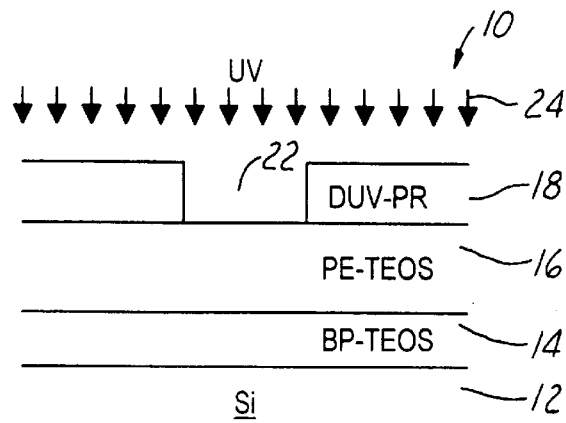
FIG. 1 is an enlarged, cross-sectional view of a present invention semiconductor structure that has layers of doped and undoped dielectric materials and a patterned deep UV photoresist deposited thereon.

Referring initially to FIG. 1, wherein an enlarged, cross-sectional view of a present invention electronic device 10 is shown. The electronic device 10 consists of a silicon substrate 12, onto which a layer 14 of doped dielectric material of BPSG is deposited by a BP-TEOS chemistry. The deposition process for the BPSG layer 14 can be advantageously carried out in a chemical vapor deposition chamber in which a TEOS (tetraethoxysilane) reactant gas is doped in-situ with boron and phosphorous. The deposition process utilizing TEOS can be carried out at a reaction temperature of between about 600° C. and about 900° C. The in-situ doping of the TEOS reactant gas can be accomplished by adding dopant gases such as phosphine ($PH_3$) for phosphorous and diborane ($B_2H_6$) for boron to a gas flow of TEOS. The deposition process can be advantageously carried out in a low pressure chemical vapor deposition (LPCVD) chamber. BPSG is thus formed by the doped TEOS reactant. A suitable thickness for the BPSG layer is between about 1,000 Å and about 4,000 Å which are normally planarized by a chemical mechanical polishing process. The undoped silicate glass (USG) layers can be deposited by the same TEOS chemistry without adding the dopant gases. The thickness for the USG layers can be between about 1,000 Å and about 4,000 Å. It should be noted that the oxide layers may also be deposited by a silane chemistry or by an ozone-TEOS chemistry in a sub-atmospheric chemical vapor deposition (SACVD) process.

After the deposition process for the BPSG layer 14 and the USG layer 16 are completed, a photoresist layer 18 is deposited on top and patterned to show cell opening 22. The patterning of the photoresist layer 18 is conducted by exposing the layer 18 to UV radiation 24 when the photoresist layer deposited is of the deep UV type.

After the photoresist layer 18 is patterned, the electronic structure 10 is subjected to a dry etching process which can be advantageously conducted in a high density plasma (HDP) apparatus such as a reactive ion etching (RIE) apparatus (not shown). In a typical RIE chamber that is equipped with a silicon roof the gas compositions of $C_2F_6$, $C_4F_8$, He, Ar and $CHF_3$ may be suitably used. An example of the recipe is a source power of 2700 W, bias power of 1400 W, $C_2F_6$ flow at 40 sccm, chamber pressure at 4 m Torr, a roof temperature of 260° C. and a chamber wall temperature of 220° C. When the process is conducted in an etcher without the silicon roof, a fusion curing process on the deep UV photoresist layer can be first conducted in order to generate a release of acidic $H^+$ ions.

Figure 2:
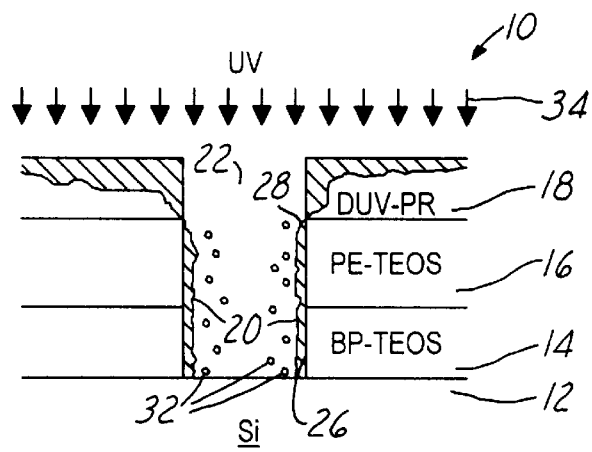
FIG. 2 is an enlarged, cross-sectional view of the present invention semiconductor structure of FIG. 1 subjected to an etch process wherein an acidic reaction product is produced by the photoresist layer.

FIG. 2 shows the electronic structure 10 after the etching process is conducted and the doped and undoped oxide layers in the cell opening 22 are removed. In order to conduct an anisotropic etching process so that a well defined straight opening is obtained, a sidewall passivation process by the polymeric photoresist layer 18 first occurs such that the sidewall 26 of the BPSG layer 14 and the sidewall 28 of the USG layer 16 are protected from undesirable lateral etching by the etchant used in RIE.

During a normal dry etching process, the effect of the present invention novel method was accidentally discovered. It was noted that when a deep UV type photoresist layer 18 is used in such RIE process, an acidic reaction product is produced by the photoresist layer 18 when it is exposed to UV admissions. In certain types of high density plasma etch chambers, an UV emission is intrinsically produced during the etching process. One of such chamber is manufactured by the Applied Materials, Inc. of Santa Clara, Calif. under the tradename of Omega® etcher. The intrinsic UV emission produced by the etch chamber reacts with the photoresist layer 18 and produces acidic reaction product 32. This is shown in FIG. 2. A sample composition of a deep UV photoresist resin is shown below:

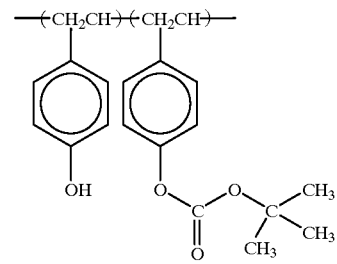

The resin is a photoacid generator (PAG). When the resin is exposed to UV radiation, hydrogen ions ($H^+$) are produced to generate an acidic reaction product. This is shown below:

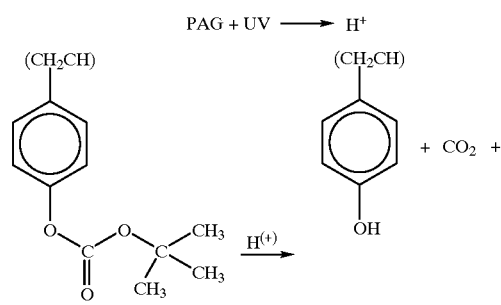

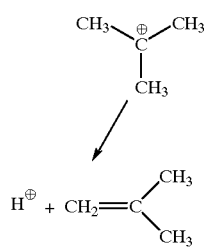

Figure 3:
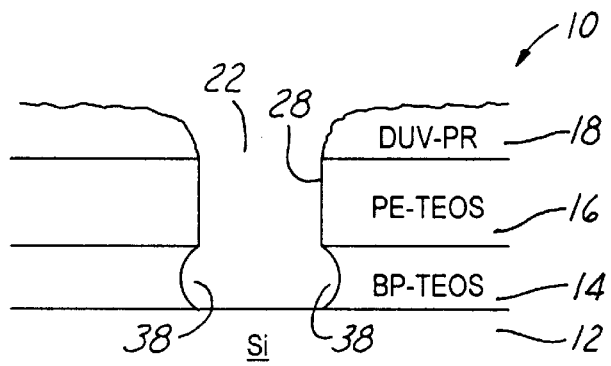
FIG. 3 is an enlarged, cross-sectional view of the present invention semiconductor structure of FIG. 2 wherein the doped dielectric layer is further etched by the acidic reaction product generated by the photoresist layer.

Under the UV radiation 34 generated in the etch chamber (not shown), the acidic product etches away the polymeric passivation layer 20 in the cell opening 22 and attacks the sidewall 26 and 28 of the doped and the undoped oxide layers 14 and 16, respectively. The doped oxide layer, due to its dopant content of boron and phosphorous, is etched by the acidic reaction product 32 a rate much greater than the undoped oxide layer 28. The result of such selective isotropic etching is shown in FIG. 3.

After the polymeric passivation layer 20 is first removed from the sidewalls 26 and 28, the surface 26 on the doped oxide layer 14 is etched further and thus producing a larger toroidal cavity 38. This is shown in FIG. 3. The accidental discovery of the present invention novel process was initially recognized as an undesirable side effect in the process for forming a straight sidewall for the capacitor cell. The unexpected etching into a lateral direction of the doped oxide layer produced the larger toroidal cavity 38, or a stepped surface in the sidewall of the cell opening 22. The additional lateral etching of cavity 38 is entirely caused by the acidic reaction product produced by the deep UV photoresist layer when exposed to UV emission in the etch chamber. The acidic reaction product contains hydrogen ions ($H^+$) which etch away first the polymeric passivation layer and then the doped oxide layer forming cavity 38.

Figure 4:
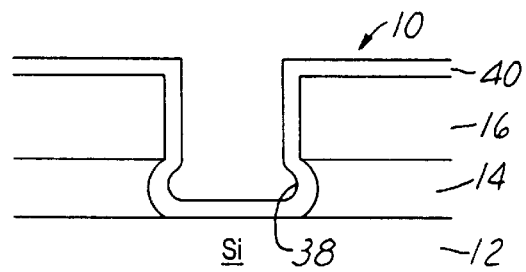
FIG. 4 is an enlarged, cross-sectional view of the present invention semiconductor structure of FIG. 3 wherein a conductive gate electrode is formed therein.

After the larger toroidal cavity 38 is formed in the doped oxide layer, thus causing the formation of a stepped sidewall in the cell opening 22, the photoresist layer 18 can be removed by a conventional wet dipping method. It should be noted that, in order to practice the present invention novel method, the photoresist layer 18 should be removed only after the larger toroidal cavity 38 is first formed. The electronic structure 10 is then coated with a conductive layer 40 formed of a material such as polysilicon. This is shown in FIG. 4. The conductive layer 40 is used as the capacitor node. On top of the conductive layer 40, additional layers of a dielectric material and a second conductive layer (not shown) can then add to form the dielectric layer and the top electrode for the capacitor.

As shown in FIG. 4, a capacitor that has increased surface area created by the toroidal cavity 38 formed by the present invention novel process is obtained. The toroidal cavity 38 formed by the acidic reaction product from the photoresist layer has a larger diameter than the toroidal cavity formed in the undoped oxide layer 16. In an alternate embodiment of the present invention, shown in FIGS. 6~9, more layers of the doped and the undoped oxide materials are utilized.

Figure 5:
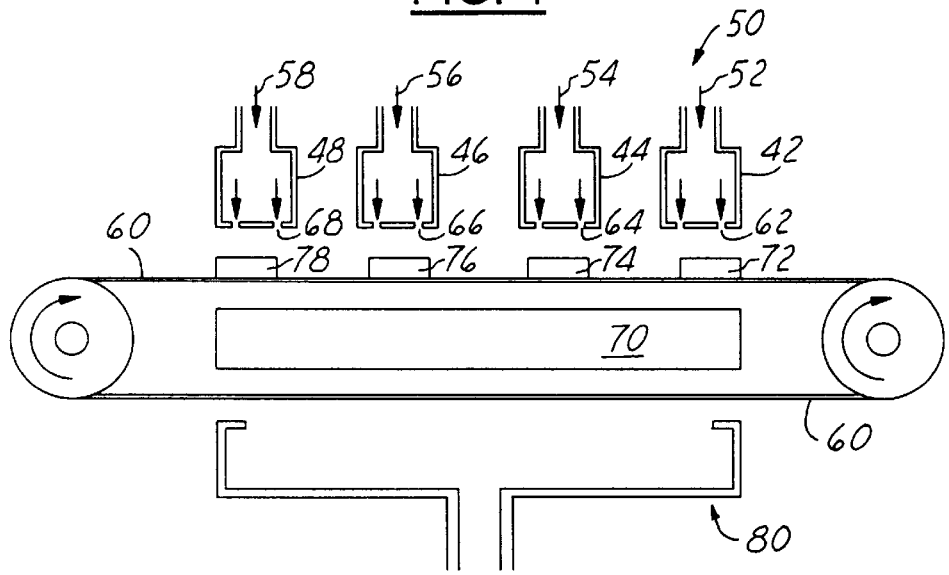
FIG. 5 is a schematic illustrating an apparatus for the sequential deposition of doped and undoped dielectric layers on top of the present invention semiconductor structure.

FIG. 5 shows a schematic for one of the possible deposition techniques that can be utilized for the present invention DRAM capacitor. A deposition apparatus 50 equipped with multiple reactant gas outlets 42, 44, 46 and 48 for depositing multiple number of films on semiconductor substrates is shown. As shown in FIG. 5, a simplified illustration of the deposition apparatus 50 which can be positioned in a conventional chemical vapor deposition chamber (not shown). The apparatus 50 is equipped with a multiple number of reactant gas outlet nozzles 42, 44, 46 and 48 each having a reactant gas mixture 52, 54, 56 and 58 flown therethrough, respectively. The outlet nozzles 42~48 are further equipped with gas outlets, or showerheads 62, 64, 66 and 68 for depositing a multiple number of films on semiconductor substrates 72, 74, 76 and 78 which are transported on a conveyor belt 60. As the mixtures of reactant gases are fed from the showerheads 62~68 onto the various substrates 72~78, a chemical reaction is induced by the heat supplied from heater 70 to form oxide films on the substrates. The spent reactant gases are exhausted through outlet 80 out of the CVD chamber.

Figure 6:
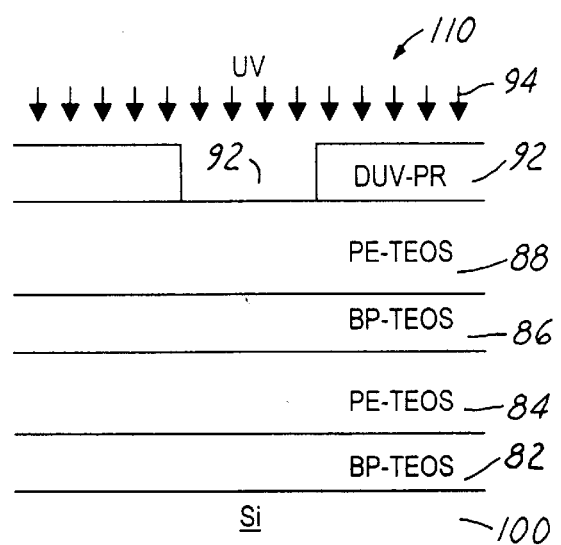
FIG. 6 is an enlarged, cross-sectional view of a second embodiment of the present invention method showing two layers of undoped dielectric material and two layers of doped dielectric material are deposited on top.
Figure 7:
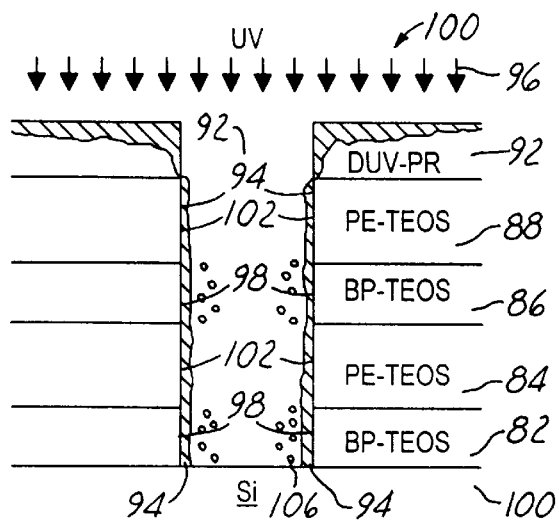
FIG. 7 is an enlarged, cross-sectional view of the present invention semiconductor structure of FIG. 6 wherein an acidic reaction produce is generated by the photoresist layer for selectively etching the doped dielectric layers.

The apparatus 50 utilized by the present invention method enables the deposition of alternating layers of doped oxide and undoped oxide on a pre-processed semiconductor substrate such as that shown in FIG. 1. The semiconductor substrates 72~78 are moved at a slow speed on conveyor belt 60 under the showerheads 62~68. Reactant gases 52~58 are fed into the respective gas nozzles 62~68. For example, the reactant gases of TEOS can be advantageously used in the four-nozzle arrangement of FIG. 5 by doping with boron and phosphorous such that an in-situ doped BP-TEOS chemistry is used to deposit BPSG films at stations where substrates 74 and 78 are located. The reactant gases 52 and 56 are not doped and thus undoped oxide layers can be formed on the substrates 72 and 76. When the conveyor belt 60 is moved at a predetermined speed, a semiconductor substrate traveling under all four nozzles 42~48 can have sequentially deposited layers of doped oxide, undoped oxide, doped oxide and undoped oxide layers 82, 84, 86 and 88, respectively as shown in FIG. 6. The speed of the conveyor belt 60 can be suitably adjusted to achieve desirable thicknesses for the various deposited films. The thickness and the quality of the films can be further adjusted by the heat supplied by heater 70 to the deposition apparatus 50. A deposition process utilizing TEOS can be carried out at a reaction temperature in the range of between about 600° C. and about 900° C. The in-situ doping of the TEOS reactant gas can be accomplished by adding dopant gases such as phosphine ($PH_3$) for phosphorous and diborane ($B_2H_6$) for boron to the TEOS gas flow. The deposition process can be advantageously carried out in a low pressure chemical vapor deposition technique. BPSG layers are thus formed by the doped TEOS reactant. Prior to the deposition process for the multiple oxide layers, the top surface of the electronic device should be planarized by either a reflow process or by a chemical mechanical polishing method before a silicon nitride etch stop layer is deposited.

An alternate embodiment of the present invention novel method is shown in FIGS. 6~9. In this alternate embodiment, two layers of doped oxide and two layers of undoped oxide are deposited alternatingly on top of silicon substrate 100. After the deposition of the doped and the undoped oxide layers 82, 84, 86 and 88, a deep UV type photoresist layer 90 is deposited and patterned on top to show a cell opening 92. The photoresist layer 92 is patterned by exposing to UV radiation 94 and then developing by a caustic-type developing solution.

Similar to the process shown in the preferred embodiment, the photoresist layer 92 is partially degraded by the UV exposure such that a polymeric based passivation layer 94 is formed on the sidewalls 98 and 102 for the doped and the undoped oxide layers, respectively. After the electronic structure 110 is subjected to a high density plasma etching process such as a reactive ion etching process, cell opening 92 is opened to expose the silicon substrate 100.

Figure 8:
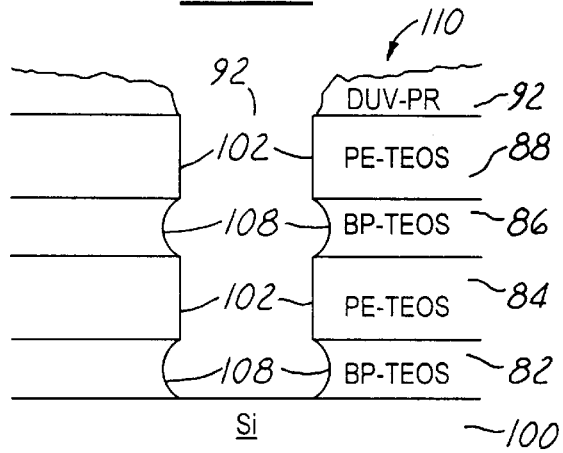
FIG. 8 is an enlarged, cross-sectional view of the present invention semiconductor structure of FIG. 7 wherein a larger toroidal cavity is formed in the doped dielectric layers than that formed in the undoped dielectric layers.

The acidic reaction product 106 generated by the photoresist layer 92 when exposed to the UV emission 96 in the etch chamber (not shown) then reacts with the sidewalls 98 of the doped oxide layer and thus forming toroidal cavities 108. This is shown in FIG. 8. The formation process for the toroidal cavities 108 is similar to that described previously in the preferred embodiment. In the alternate embodiment where two layers each of the doped and the undoped oxide are deposited, additional toroidal cavities are formed such that a larger surface area in the capacitor node can be later formed.

Figure 9:
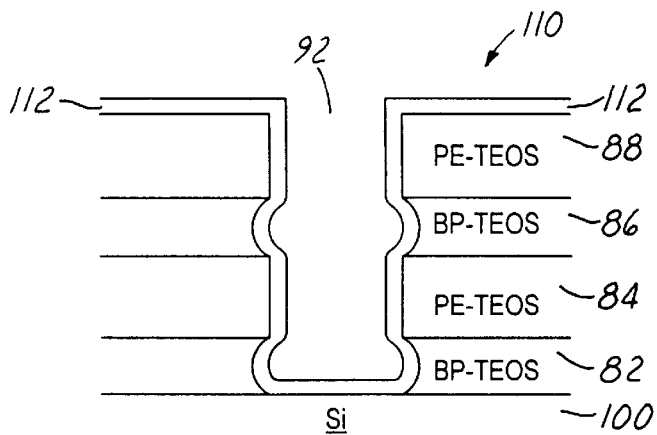
FIG. 9 is an enlarged, cross-sectional view of the present invention semiconductor structure of FIG. 8 wherein a conductive gate electrode is formed in the cell opening.

In the next step of the process, as shown in FIG. 9, a contact node layer 112 is deposited of a conductive material such as polysilicon on top of the electronic device 110. The deposition is carried out after the photoresist layer 92 is first removed by a conventional wet dipping method. After the formation of the node contact layer 112, additional layers of a dielectric material and a second layer of conducting material (not shown) can be sequentially deposited into the cell opening 92 and thus completing the capacitor forming process.

The present invention novel method for forming a DRAM capacitor that has improved charge storage capacity has therefore been amply demonstrated in the above descriptions and the appended drawings of FIGS. 1~9. In the preferred and the alternate embodiment, an acidic reaction product is formed by a deep UV photoresist layer when exposed to UV emissions during an etching process of high density plasma. The acidic reaction product then etches a larger surface area away in a lateral direction in the doped oxide layer and thus forming a stepped sidewall inside the cell opening. The type of photoresist layer that generates an acidic reaction product may be suitably a deep UV type or an I-line type. The present invention novel feature of a stepped sidewall in a cell opening is thus obtained by a selective isotropic etching process by the acidic reaction product produced from a photoresist layer.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a DRAM capacitor comprising the steps of:
   providing a substrate,
   depositing a layer of a doped dielectric material on said substrate,
   depositing a layer of an undoped dielectric material on said doped dielectric layer,
   depositing a layer of a photoresist material on said undoped dielectric layer, said photoresist layer generates an acidic reaction product when exposed to UV radiation,
   patterning said photoresist layer for a capacitor cell opening, and
   etching said cell opening through said undoped and doped dielectric layers exposing said substrate by a technique that generates UV emission such that an acidic reaction product is released from said photoresist layer to selectively etching said doped dielectric layer in a lateral direction to a larger toroidal cavity than the toroidal cavity formed in said undoped dielectric layer.

2. A method for forming a DRAM capacitor according to claim 1 further comprising the steps of:
   depositing a second layer of said doped dielectric material on said undoped dielectric layer, and
   depositing a second layer of undoped dielectric material on said second doped dielectric layer.

3. A method for forming a DRAM capacitor according to claim 1, wherein said dielectric material is silicon oxide.

4. A method for forming a DRAM capacitor according to claim 1, wherein said substrate is a pre-processed electronic device.

5. A method for forming a DRAM capacitor according to claim 1, wherein said substrate is a pre-processed semiconductor device.

6. A method for forming a DRAM capacitor according to claim 1, wherein said doped dielectric material is selected from the group consisting of borophosphosilicate glass (BPSG), borosilicate glass (BSG) or phosphosilicate glass (PSG).

7. A method for forming a DRAM capacitor according to claim 1, wherein said undoped dielectric material is an undoped silicon oxide.

8. A method for forming a DRAM capacitor according to claim 1, wherein said photoresist material comprises a photoacid generator.

9. A method for forming a DRAM capacitor according to claim 1 further comprising the steps of:
   depositing a first conducting layer in said cell opening,
   depositing a dielectric layer on said first conducting layer, and
   depositing a second conducting layer on said dielectric layer, thereby forming said capacitor.

10. A method for forming a DRAM capacitor according to claim 1, wherein said photoresist material is a deep UV material or an I-line material.

11. A method for forming a DRAM capacitor according to claim 1, wherein said patterning step further comprising:
    exposing said photoresist layer to UV radiation, and
    developing said cell opening by a caustic-based developing solution.

12. A method for forming a multi-anchor capacitor electrode comprising the steps of:
    providing a substrate,
    depositing a first layer of a doped silicon oxide on said substrate,
    depositing a first layer of an undoped silicon oxide on said first layer of doped silicon oxide,
    depositing a second layer of said doped silicon oxide on said second layer of undoped silicon oxide,
    depositing a second layer of said undoped silicon oxide on said second layer of doped silicon oxide,
    depositing a layer of photoresist material on said undoped dielectric layer, said photoresist layer generates an acidic reaction product when exposed to UV radiation,
    patterning said photoresist layer for a capacitor cell opening, and
    etching said cell opening through said undoped and doped dielectric layers by a technique that generates UV emission such that an acidic reaction product is released from said photoresist layer to selectively etching said doped dielectric layer in a lateral direction to a larger toroidal cavity than the toroidal cavity formed in said undoped dielectric layer.

13. A method for forming a multi-anchor capacitor electrode according to claim 12, wherein said dielectric material is silicon oxide.

14. A method for forming a multi-anchor capacitor electrode according to claim 12, wherein said substrate is a pre-processed electronic device.

15. A method for forming a multi-anchor capacitor electrode according to claim 12, wherein said substrate is a pre-processed semiconductor device.

16. A method for forming a multi-anchor capacitor electrode according to claim 12, wherein said doped dielectric material is selected from the group consisting of borophosphosilicate glass (BPSG), borosilicate glass (BSG) or phosphosilicate glass (PSG).

17. A method for forming a multi-anchor capacitor electrode according to claim 12, wherein said undoped dielectric material is undoped silicate glass.

18. A method for forming a multi-anchor capacitor electrode according to claim 12, wherein said photoresist material comprises a photoacid generator.

19. A method for forming a multi-anchor capacitor electrode according to claim 12, wherein said photoresist material is a deep UV material or an I-line material.

20. A method for forming a multi-anchor capacitor according to claim 12, wherein said patterning step further comprising:

exposing said photoresist layer to UV radiation, and developing said cell opening by a caustic-based developing solution.

* * * * *